(12) United States Patent
Watanabe

(10) Patent No.: US 11,782,319 B2
(45) Date of Patent: *Oct. 10, 2023

(54) DISPLAY DEVICE

(71) Applicant: Japan Display Inc., Tokyo (JP)

(72) Inventor: Kyosuke Watanabe, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/167,105

(22) Filed: Feb. 10, 2023

(65) Prior Publication Data

US 2023/0194939 A1 Jun. 22, 2023

Related U.S. Application Data

(63) Continuation of application No. 17/528,198, filed on Nov. 17, 2021, now Pat. No. 11,604,390.

(30) Foreign Application Priority Data

Nov. 26, 2020 (JP) ................................. 2020-195814

(51) Int. Cl.
| | |
|---|---|
| *G02F 1/1368* | (2006.01) |
| *G02F 1/1362* | (2006.01) |
| *H01L 27/12* | (2006.01) |
| *H01L 29/786* | (2006.01) |
| *G02F 1/1333* | (2006.01) |

(52) U.S. Cl.
CPC ...... *G02F 1/136227* (2013.01); *G02F 1/1368* (2013.01); *G02F 1/133345* (2013.01); *G02F 1/136209* (2013.01); *G02F 1/136222* (2021.01); *G02F 1/136286* (2013.01); *H01L 27/124* (2013.01); *H01L 27/1248* (2013.01); *H01L 29/78633* (2013.01)

(58) Field of Classification Search
CPC ......... G02F 1/136227; G02F 1/133345; G02F 1/136209; G02F 1/136222; G02F 1/136286; G02F 1/1368; H01L 27/124; H01L 27/1248; H01L 29/78633
See application file for complete search history.

(56) References Cited

U.S. PATENT DOCUMENTS

2005/0146649 A1 * 7/2005 Sato .................. G02F 1/136209
349/44

* cited by examiner

*Primary Examiner* — James A Dudek
(74) *Attorney, Agent, or Firm* — XSENSUS LLP

(57) ABSTRACT

According to one embodiment, a display device includes a base, a switching element disposed above the base, a scanning line which supplies a scanning signal to the switching element, an organic insulating layer covering the switching element and having a contact hole, a pixel electrode disposed above the organic insulating layer and connected to the switching element through the contact hole, and a metal line disposed above the organic insulating layer and extending parallel to the scanning line. The scanning line, the metal line and the contact hole overlap each other in planar view.

10 Claims, 15 Drawing Sheets

DISPLAY DEVICE

CROSS-REFERENCE TO RELATED APPLICATIONS

This application is a continuation of U.S. application Ser. No. 17/528,198, filed Nov. 17, 2021, which is based upon and claims the benefit of priority from Japanese Patent Application No. 2020-195814, filed Nov. 26, 2020, the entire contents of each are incorporated herein by reference.

FIELD

Embodiments described herein relate generally to a display device.

BACKGROUND

Recently, display devices such as liquid crystal display devices have been required to have even higher definition. In order to achieve higher definition, it is necessary to increase the efficiency of the layout of various wiring lines and a contact hole for connecting a pixel electrode and a switching element (thin-film transistor) disposed in a display area.

DETAILED DESCRIPTION

Figure 1:
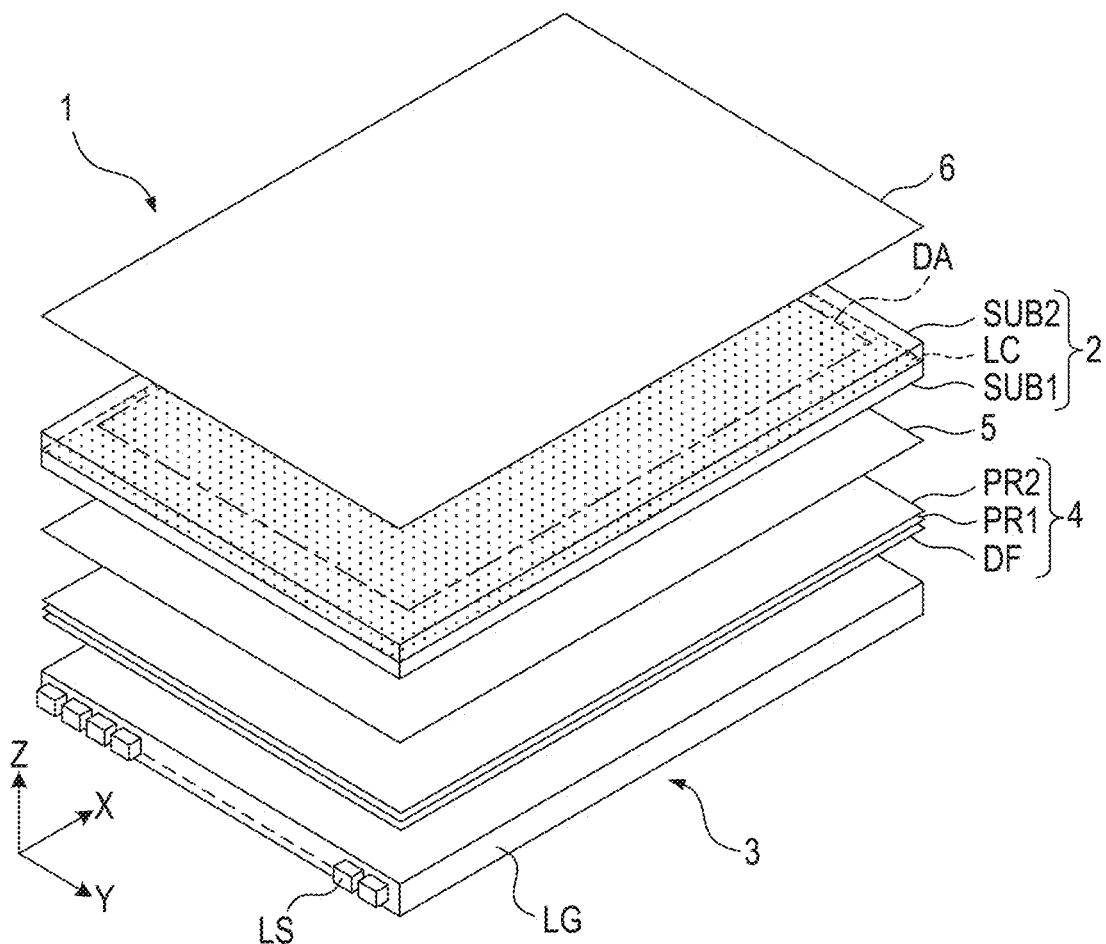
FIG. 1 is an exploded perspective view schematically showing a configuration example of a liquid crystal display device according to the first embodiment.

In general, according to one embodiment, there is provided a display device comprising a base, a switching element disposed above the base, a scanning line which supplies a scanning signal to the switching element, an organic insulating layer covering the switching element and having a contact hole, a pixel electrode disposed above the organic insulating layer and connected to the switching element through the contact hole, and a metal line disposed above the organic insulating layer and extending parallel to the scanning line. The scanning line, the metal line and the contact hole overlap each other in planar view.

According to another embodiment, there is provided a display device comprising a base, a switching element disposed above the base, a scanning line which supplies a scanning signal to the switching element, an organic insulating layer covering the switching element and having a contact hole, a pixel electrode disposed above the organic insulating layer and connected to the switching element through the contact hole, and a light-shielding layer overlapping the scanning line and the contact hole. Layers disposed between the organic insulating layer and the light-shielding layer are recessed toward an inside of the contact hole, and thereby form a recessed portion. The light-shielding layer covers a corner portion formed at an edge of the recessed portion.

According to these configurations, a display device capable of achieving higher definition can be provided.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the respective parts are illustrated schematically in the drawings, rather than as an accurate representation of what is implemented. However, such schematic illustration is merely exemplary, and in no way restricts the interpretation of the invention. In the drawings, reference numbers of continuously arranged elements equivalent or similar to each other are omitted in some cases. In addition, in the specification and drawings, constituent elements which function in the same or a similar manner to those described in connection with preceding drawings are denoted by the same reference numbers, and detailed description thereof which is considered redundant is omitted in some cases.

As an example in the embodiments, a liquid crystal display device comprising a liquid crystal display element is disclosed. However, the embodiments do not preclude the application of individual technical ideas disclosed in the embodiments to a display device comprising another display element such as an organic electroluminescent display element, a micro-LED or a mini-LED, for example. In addition, the technical ideas disclosed in the embodiments are also applicable to an array substrate or an electronic device comprising a sensor element such as an electrostatic capacitive sensor or an optical sensor.

First Embodiment

FIG. 1 is an exploded perspective view schematically showing a configuration example of a liquid crystal display device 1 (hereinafter referred to as a display device 1) according to the first embodiment. An X direction, a Y direction and a Z direction are defined as shown in the drawing. These X, Y and Z directions are orthogonal to each other in the present embodiment but may intersect each other at an angle other than a right angle. Viewing the display device 1 or its constituent elements parallel to the Z direction is referred to as planar view. In addition, in some cases, a direction indicated by the arrow of the Z direction is referred to as above, and the opposite direction is referred to as below.

The display device 1 comprises a display panel 2 and a backlight 3. In the example of FIG. 1, the backlight 3 is a side-edge backlight comprising a light guide LG opposed to the display panel 2 and a plurality of light-emitting elements LS opposed to a side surface of the light guide LG. However, the configuration of the backlight 3 is not limited to the example of FIG. 1 but only needs to be configured to supply light required for image display.

In the example of FIG. 1, the display panel 2 and the light guide LG are both formed in a rectangular shape having long sides along the X direction and short sides along the Y direction. The display panel 2 and the light guide LG are not limited to a rectangular shape but may be formed in another shape.

The display panel 2 is a transmissive liquid crystal panel, and comprises a first substrate SUB1 (array substrate), a second substrate SUB2 (counter substrate) opposed to the first substrate SUB1, and a liquid crystal layer LC sealed in between these substrates SUB1 and SUB2. The display panel 2 has a display area DA having a rectangular shape, for example.

The display device 1 further comprises an optical sheet group 4, a first polarizer 5 and a second polarizer 6. The optical sheet group 4 is disposed between the light guide LG and the display panel 2. For example, the optical sheet group 4 includes a diffusion sheet DF which diffuses light emitted from the light guide LG, and a first prism sheet PR1 and a second prism sheet PR2 in which a large number of prisms are formed.

The first polarizer 5 is disposed between the optical sheet group 4 and the first substrate SUB1. The second polarizer 6 is disposed above the second substrate SUB2. The polarization axis of the first polarizer 5 and the polarization axis of the second polarizer 6 are in a crossed Nicols relationship in which they are orthogonal to each other.

The display device 1 can be used in various devices such as a vehicle-mounted device, a smartphone, a tablet terminal, a mobile telephone terminal, a personal computer, a television receiver and a game console, for example.

Figure 2:
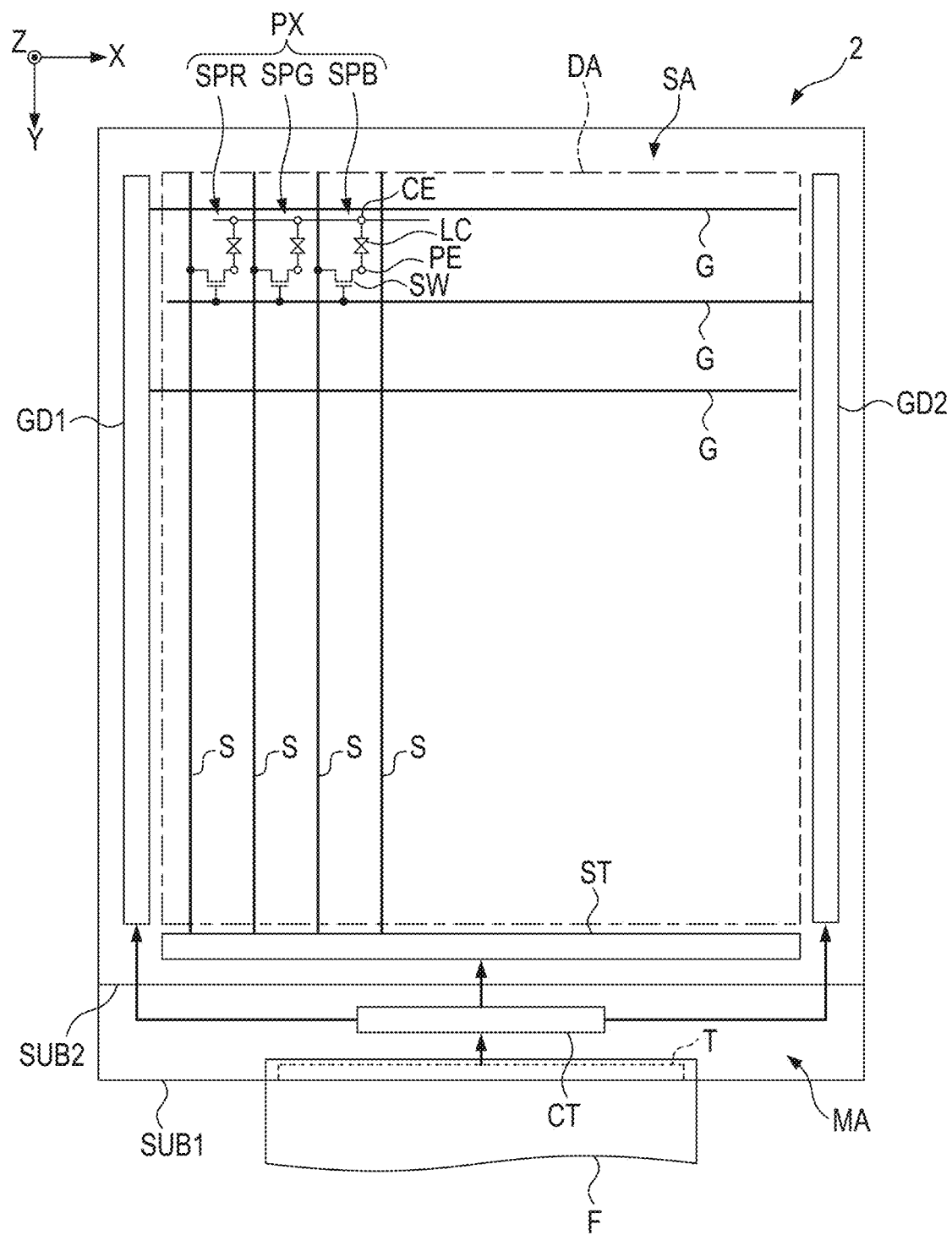
FIG. 2 is a schematic plan view of a display panel according to the first embodiment.

FIG. 2 is a schematic plan view of the display panel 2. The display panel 2 has the display area DA and a surrounding area SA therearound. In the example of FIG. 2, the lower side in the drawing of the first substrate SUB1 projects more in the Y direction than the second substrate SUB2. Accordingly, a mounting area MA not overlapping the second substrate SUB2 is formed in the first substrate SUB1. The mounting area MA is a part of the surrounding area SA.

In the display area DA, a plurality of pixels PX are arranged in a matrix. Each pixel PX includes a plurality of subpixels. As an example in the present embodiment, the pixel PX includes a red subpixel SPR, a green subpixel SPG and a blue subpixel SPB. However, the pixel PX may include a subpixel of another color such as white.

The display panel 2 comprises a plurality of scanning lines G, a plurality of signal lines S (image lines), a first scanning driver GD1, a second scanning driver GD2 and a selector circuit ST. The scanning lines G extend in the X direction and are arranged in the Y direction. The signal lines S extend in the Y direction and are arranged in the X direction. Each scanning line G is connected to the first scanning driver GD1 or the second scanning driver GD2. Each signal line S is connected to the selector circuit ST.

In the example of FIG. 2, a controller CT is mounted on the mounting area MA. In addition, a terminal portion T is provided in the mounting area MA, and a flexible printed circuit F is connected to the terminal portion T. It should be noted that the controller CT may be mounted on the flexible printed circuit F. The controller CT can be composed of an IC or various circuit elements.

The flexible printed circuit F inputs, to the controller CT, various signals transmitted from a circuit board or the like of an electronic device on which the display device 1 is mounted. The controller CT supplies image signals to the selector circuit ST based on the input signals, and also controls the first scanning driver GD1, the second scanning driver GD2 and the selector circuit ST. The scanning drivers GD1 and GD2 sequentially supply scanning lines to the scanning lines G. The selector circuit ST sequentially supplies the input image signals to the signal lines S.

Each pixel PX includes a pixel electrode PE, a switching element SW (thin-film transistor), and a common electrode CE to which a common voltage is supplied. The switching element SW is connected to the pixel electrode PE, the scanning line G and the signal line S, and supplies the image signal of the signal line S to the pixel electrode PE when the scanning signal is supplied to the scanning line G. The common electrode CE is formed over the subpixels. When the image signal is supplied to the pixel electrode PE, a potential difference is formed between the pixel electrode PE and the common electrode CE, and an electric field thereby generated acts on the liquid crystal layer LC.

In the present embodiment, the scanning lines G, the signal lines S, the first scanning driver GD1, the second scanning driver GD2, the selector circuit ST, the switching elements SW, the pixel electrodes PE and the common electrode CE are all formed in the first substrate SUB1.

Figure 3:
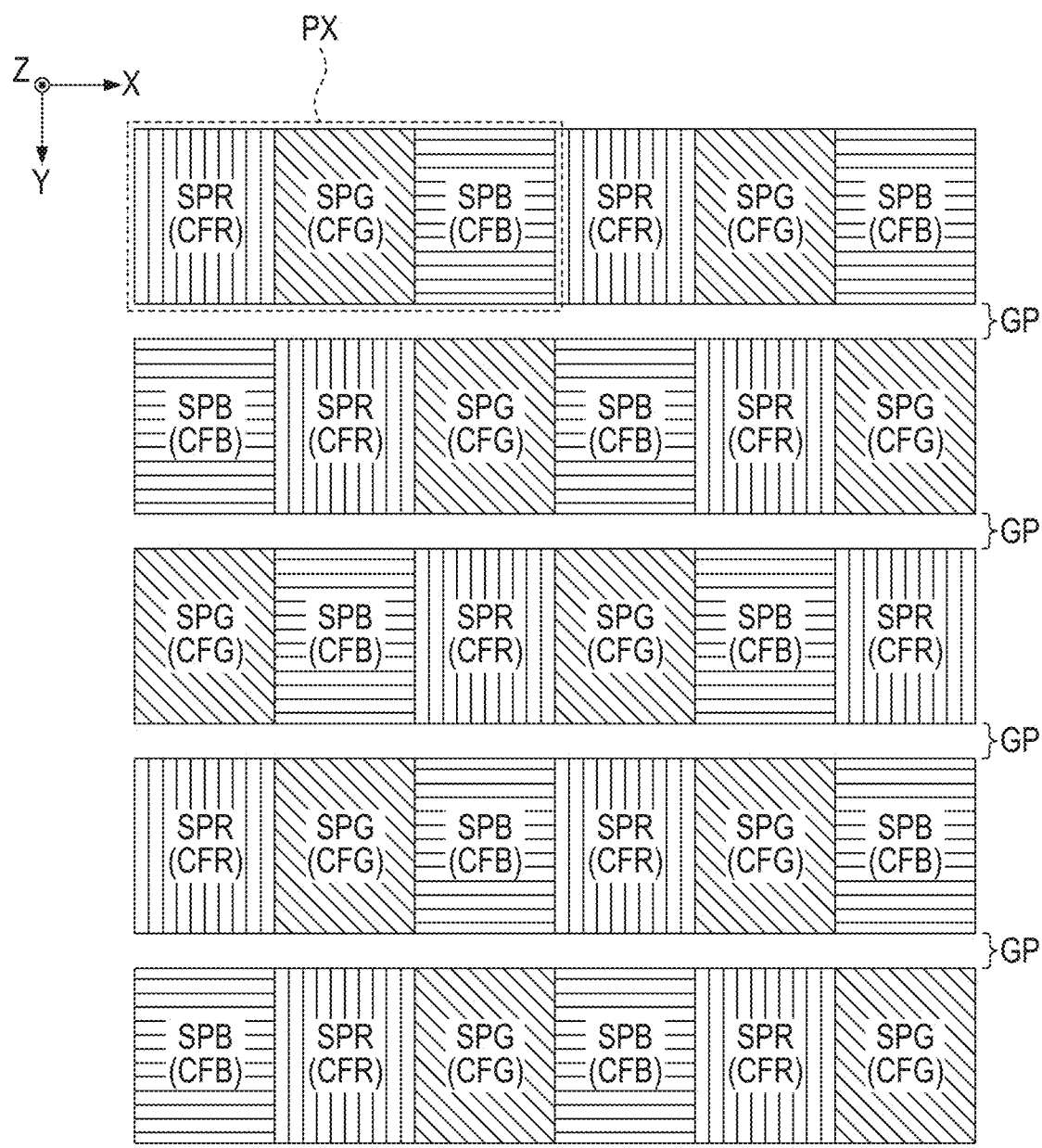
FIG. 3 is a schematic plan view showing an example of the layout of subpixels.

FIG. 3 is a schematic plan view showing an example of the layout of the subpixels SPR, SPG and SPB. A red color filter CFR is disposed in the subpixel SPR, a green color filter CFG is disposed in the subpixel SPG, and a blue color filter CFB is disposed in the subpixel SPB. In the present embodiment, the display device 1 has a color filter on array (COA) structure in which the color filters CFR, CFG and CFB are all disposed in the first substrate SUB1.

In the example of FIG. 3, the subpixels SPR, SPG and SPB are arranged in this order in the X direction. In addition, the subpixels SPR, SPB and SPG are arranged in this order in the Y direction. Accordingly, the subpixels SPR are arranged in an oblique direction intersecting the X direction and the Y direction. Similarly, the subpixels SPG are arranged in the oblique direction, and the subpixels SPB are arranged in the oblique direction.

The color filters CFR, CFG and CFB are disposed like dots (islands) for the subpixels SPR, SPG and SPB. A gap GP is formed between the color filters CFR, CFG and CFB which are adjacent to each other in the Y direction.

The layout of the subpixels SPR, SPG and SPB and the color filters CFR, CFG and CFB is not limited to the example illustrated here. For example, the subpixels SPR may be arranged in the Y direction, the subpixels SPG may be arranged in the Y direction, the subpixels SPB may be arranged in the Y direction, and the line of subpixels SPR, the line of subpixel SPG and the line of subpixels SPB may be arranged in the X direction.

Figure 4:
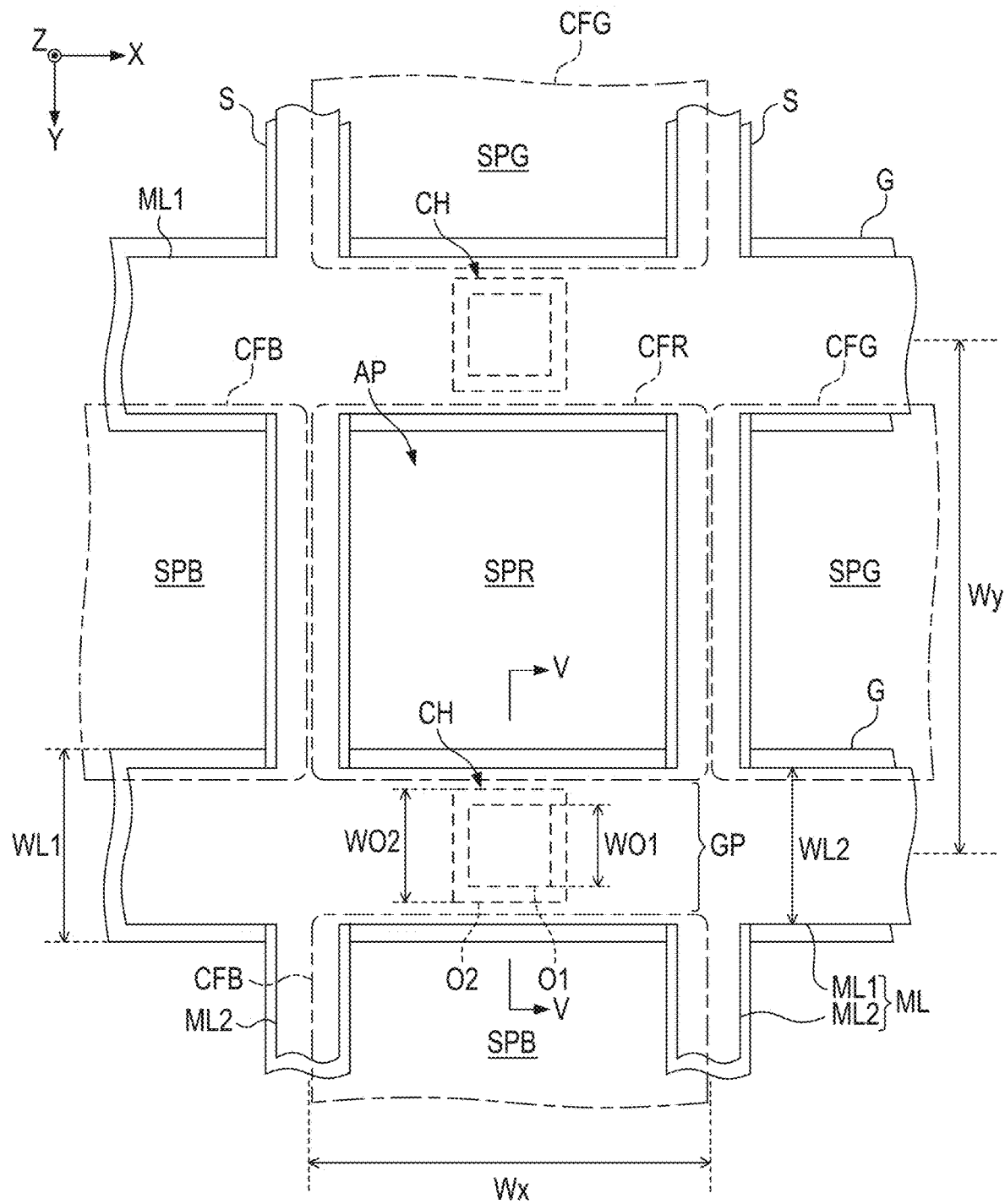
FIG. 4 is a schematic plan view showing part of elements constituting the subpixel.
Figure 5:
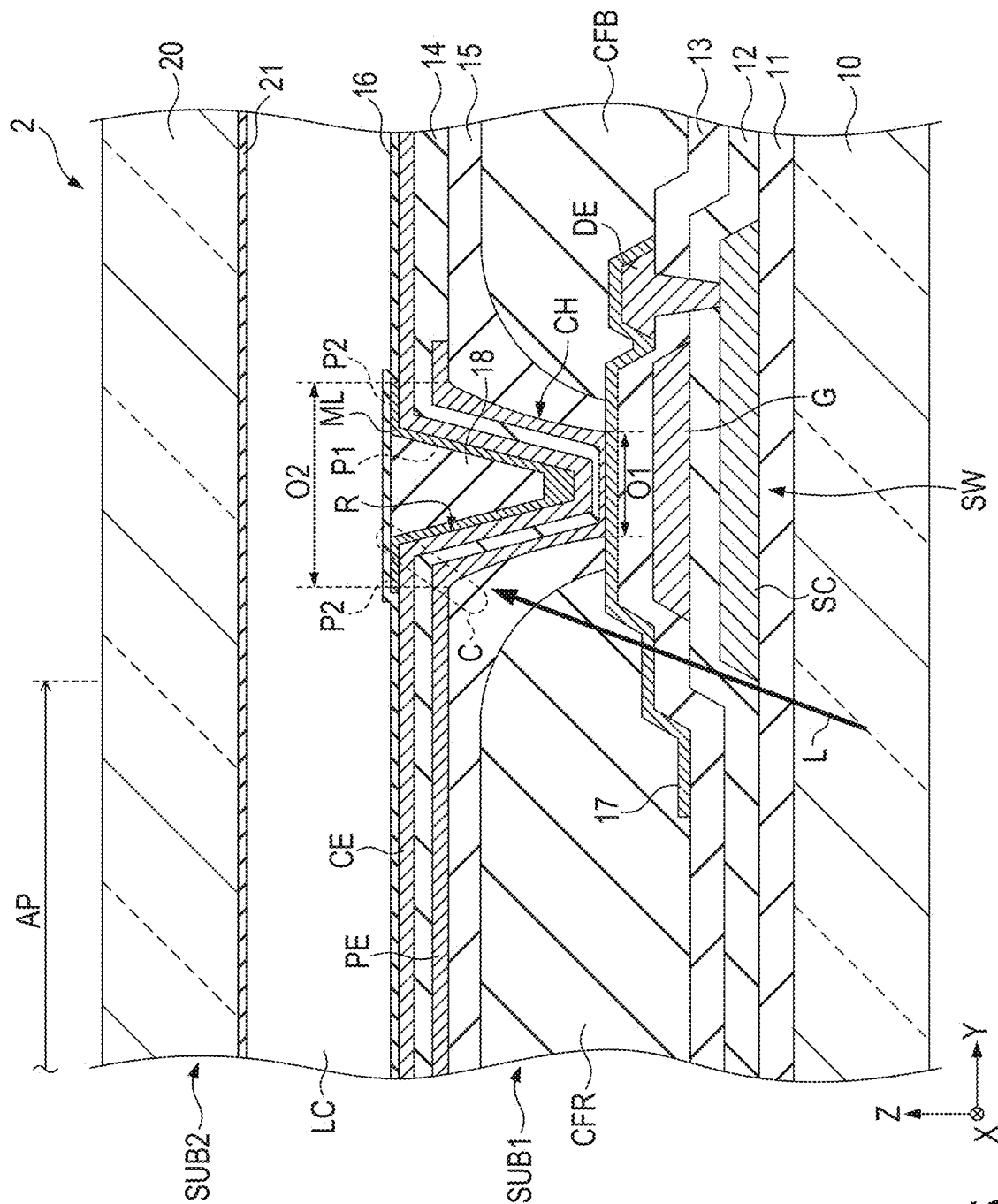
FIG. 5 is a schematic cross-sectional view of the display panel along line V-V in FIG. 4.

FIG. 4 is a schematic plan view showing part of elements constituting the subpixel. FIG. 5 is a schematic cross-sectional view of the display panel 2 along line V-V in FIG. 4. Although the configuration of the subpixel SPR is mainly illustrated in these drawings, the subpixels SPG and SPB also have the same configuration as the subpixel SPR. The illustration of the pixel electrode PE, the common electrode CE, the switching element SW and the like is omitted in FIG. 4.

In FIG. 4, two scanning lines G and two signal lines S intersecting these scanning lines G are illustrated. An aperture AP of the subpixel SPR is formed in an area surrounded by these scanning lines G and signal lines S.

The aperture AP overlaps the color filter CFR. The color filters CFB and CFG are disposed respectively in the subpixels SPB and SPG which are adjacent to the subpixel SPR in the X direction. The color filter CFG and CFB are disposed respectively in the subpixels SPG and SPB which are adjacent to the subpixel SPR in the Y direction.

Both end portions in the X direction of each of the color filters CFR, CFG and CFB overlap the signal lines S. The end portions of the adjacent color filters may be in contact with each other or may overlap each other above the signal line S. Both end portions in the Y direction of each of the color filters CFR, CFG and CFB overlap the scanning lines G. The above-described gap GP is formed between the end portions of the adjacent color filters above the scanning line G.

Metal lines ML are disposed above the scanning lines G and the signal lines S. The metal lines ML have a plurality of first line portions ML1 and a plurality of second line portions ML2. The first line portions ML1 overlap the scanning lines G, and extend parallel to the scanning lines G. The second line portions ML2 overlap the signal lines S, and extend parallel to the signal lines S. The first line portions ML1 and the second line portions ML2 do not protrude over the aperture AP of each of the subpixels SPR, SPG and SPB. According to the first line portions ML1 and the second line portions ML2, the metal lines ML have a lattice planar shape as a whole. In the present embodiment, the metal lines ML have a function as a light-shielding layer which light shields the boundaries of subpixels, contact-holes CH which will be described later, and the like.

The subpixel SPR have a width Wx in the X direction and a width Wy in the Y direction. The width Wx corresponds to the distance between the centers in the X direction of the adjacent signal lines S. The width Wy corresponds to the distance between the centers in the Y direction of the adjacent scanning lines G. For example, the width Wx is less than or equal to 9 µm, and the width Wy is less than or equal to 12 µm. Preferably, the width Wx is less than or equal to 6 µm, and the width Wy is less than or equal to 9 µm. When the widths Wy and Wx are small like this, the display device 1 having high definition can be realized.

As shown in FIG. 5, the first substrate SUB1 comprises the scanning line G, the switching element SW, the pixel electrode PE, the common electrode CE, the metal line ML and the color filters CFR and CFB described above. Although not shown in the cross section of FIG. 5, the first substrate SUB1 also comprises the signal line S and the color filter CFG described above.

The first substrate SUB1 further comprises a first insulating base 10, a first insulating layer 11, a second insulating layer 12, a third insulating layer 13, a fourth insulating layer 14, an organic insulating layer 15, a first alignment film 16 and a relay electrode 17.

The first insulating base 10 is formed of, for example, glass but may be formed of a resin material such as polyimide. The insulating layers 11 to 14 are formed of an inorganic material such as silicon nitride or silicon oxide. The organic insulating layer 15 is formed of an organic material such as acrylic resin. The pixel electrode PE, the common electrode CE and the relay electrode 17 are formed of a transparent conductive material such as indium tin oxide (ITO). The scanning line G, the signal line S and the metal line ML are formed of a metal material. The scanning line G, the signal line S and the metal line ML may have a single-layer structure formed of a single metal material or may have a multilayer structure formed of different metal materials stacked on top of each other. The metal line ML is preferably formed of a material having low reflectance. As an example, the metal line ML has a single-layer structure of molybdenum tungsten alloy (MoW) or a laminated structure of molybdenum, aluminum and molybdenum (MAM).

The first insulating layer 11 covers the upper surface (second substrate SUB2 side surface) of the first insulating base 10. A semiconductor layer SC of polysilicon or the like provided in the switching element SW is disposed on the first insulating layer 11. The second insulating layer 12 covers the semiconductor layer SC and the first insulating layer 11.

The scanning line G is disposed on the second insulating layer 12. The third insulating layer 13 covers the scanning line G and the second insulating layer 12. A drain electrode DE of the switching element SW is disposed on the third insulating layer 13. Although not shown in the cross section of FIG. 5, the signal line S is also disposed on the third insulating layer 13. The drain electrode DE can be formed of the same metal material as the signal line S. The relay electrode 17 is formed on the third insulating layer 13, and is in contact with the drain electrode DE. The relay electrode 17 intersects the scanning line G.

The drain electrode DE is in contact with the semiconductor layer SC through a contact hole penetrating the second insulating layer 12 and the third insulating layer 13. The signal line S is also in contact with the semiconductor layer SC through a contact hole penetrating the second insulating layer 12 and the third insulating layer 13. A part of the signal line S which is in contact with the semiconductor layer SC constitutes a source electrode of the switching element SW. The semiconductor layer SC intersects the scanning line G. A part of the scanning line G which is opposed to the semiconductor layer SC constitutes a gate electrode of the switching element SW.

The color filters CFR, CFG and CFB are disposed on the drain electrode DE, the relay electrode 17 and the third insulating layer 13. The organic insulating layer 15 covers the switching element SW and the color filters CFR, CFG and CFB. The color filters CFR, CFG and CFB and the organic insulating layer 15 are formed thicker than the other insulating layers 11 to 14. The organic insulating layer 15 planarizes unevenness caused by the switching element SW and the color filters CFR, CFG and CFB.

The organic insulating layer 15 has a contact hole CH. The contact hole CH is located in the gap GP shown in FIG. 4, and penetrates the organic insulating layer 15. The pixel electrode PE is disposed on the organic insulating layer 15. The pixel electrode PE is in contact with the relay electrode 17 through the contact hole CH. That is, the pixel electrode PE is connected to the switching element SW through the contact hole CH and the relay electrode 17.

The fourth insulating layer 14 covers the pixel electrode PE and the organic insulating layer 15. The common electrode CE is disposed on the fourth insulating layer 14. The common electrode CE has a slit in the aperture AP, and is opposed to the pixel electrode PE. The metal line ML is disposed on the common electrode CE, and is in contact with the common electrode CE. That is, as is the case with the common electrode CE, the common voltage is applied to the metal line ML. The metal line ML makes the common electrode CE formed of a transparent conductive material less resistive. It should be noted that the metal line ML may be disposed under the common electrode CE. The first alignment film 16 covers the common electrode CE and the metal line ML.

The second substrate SUB2 comprises a second insulating base 20 formed of the same material as the first insulating base 10, and a second alignment film 21 covering the lower surface (first substrate SUB1 side surface) of the second insulating base 20. The first substrate SUB1 and the second substrate SUB2 are bonded together by an annular sealing material in the surrounding area SA. The liquid crystal layer LC is sealed in between the first substrate SUB1 and the second substrate SUB2.

As shown in FIGS. 4 and 5, the scanning line G, the metal line ML (first line portion ML1) and the contact hole CH overlap in planar view. For example, the centers in the Y direction of the scanning line G, the metal line ML (first line portion ML1) and the contact hole CH match each other.

The scanning line G has a first line width WL1 in the Y direction. The first line portion ML1 of the metal line ML has a second line width WL2 in the Y direction. The contact hole CH has a first opening width WO1 at a lower end portion O1 on the switching element SW side, and has a second opening width WO2 at an upper end portion O2 on the opposite side to the lower end portion O1.

In the example of FIG. 4, the width of the scanning line G is the first line width WL1 and constant over the entirety, and the width of the first line portion ML1 is the second line width WL2 and constant over the entirety. That is, at a position overlapping the contact hole CH, the width of the scanning line G is the first line width WL1, and the width of the first line portion ML1 is the second line width WL2. It should be noted that the widths of the scanning line G and the first line portion ML1 may partly vary.

In the present embodiment, the second line width WL2 is less than the first line width WL1 (WL1>WL2). In addition, the second line width WL2 is greater than the first opening width WO1 and the second opening width WO2 (WL2>WO1, WO2). The first line portion ML1 completely overlaps the scanning line G in planar view, and does not protrude from the scanning line G. In addition, the contact hole CH completely overlaps the first line portion ML1 in planar view, and does not protrude from the first line portion ML1.

If the first line portion ML1 protrudes from the scanning line G, the aperture AP becomes small. In order to suppress this, the second line width WL2 is preferably less than the first line width WL1 by greater than or equal to 1 μm. As an example, the first line width WL1 is 5 μm, the second line width WL2 is 4 μm, and the second opening width WO2 is 3 μm.

As shown in FIG. 5, at a position where the contact hole CH is formed, layers (the pixel electrode PE, the fourth insulating layer 14 and the common electrode CE in the present embodiment) disposed between the organic insulating layer 15 and the metal line ML are recessed toward the inside of the contact hole CH. Accordingly, a recessed portion R corresponding to the shape of the contact hole CH is formed in these layers. By this recessed portion R, the metal lime ML is also recessed toward the inside of the contact hole CH at the position overlapping the contact hole.

At the position overlapping the contact hole CH, the metal line ML has a first part P1 entirely covering the inner surface of the common electrode CE in the recessed portion R, and a second part P2 covering the surface of the common electrode CE around the recessed portion R. At least a part of the second part P2 projects more upward than the surface of an area of the common electrode CE which does not overlap the contact hole CH (for example, the surface of the common electrode CE in the aperture AP).

In the example of FIG. 5, the inside of the contact hole CH, more specifically, the inside of the first part P1 in the recessed portion R is filled with a filling material 18. The filing material 18 is formed of, for example, the same organic material as the organic insulating layer 15. The upper surface of the filling material 18 is covered with the first alignment film 16.

When the filling material 18 is provided, the first alignment film 16 is planarized at the position overlapping the contact hole CH. Accordingly, alignment disorder of liquid crystal molecules included in the liquid crystal layer LC can be suppressed near the contact hole CH.

In the configuration of the present embodiment described above, the contact hole CH is provided at a position overlapping the metal line ML and the scanning line G. If the contact hole CH is located in the aperture AP, in order to suppress display disorder caused by the contact hole CH, this area needs to be light shielded. In contrast, according to the configuration of the present embodiment, the contact hole CH is light shielded by the scanning line G and the metal line ML so that most of the aperture AP can be used for display. By increasing the efficiency of the layout of the elements disposed in the display area DA as described above, it is possible to increase display quality even in the high-definition display device.

In the COA type display device 1 where the first substrate SUB1 comprises the color filters CFR, CFG and CFB, the contact hole CH becomes deeper and larger than that where the second substrate SUB2 comprises the color filters. When the layout of the metal line ML, the contact hole CH and the scanning line G according to the present embodiment is applied to the COA type display device 1, the above-described effect becomes more significant.

In the present embodiment, the metal line ML covers the inner surface of the recessed portion R generated by the contact hole CH. In this case, the contact hole CH can be light shielded more preferably.

When a lattice-like light-shielding layer (black matrix) is disposed in the second substrate SUB2 in the high-definition display device, if the first substrate SUB1 and the second substrate SUB2 are misaligned with each other, the aperture ratio of the subpixels may be significantly reduced. In contrast, when the metal lines ML are disposed like a lattice as in the present embodiment, the boundaries of the subpixels can be light shielded without disposing the light-shielding layer in the second substrate SUB2. When the light-shielding layer is not disposed in the second substrate SUB2, the reduction of the aperture ratio caused by the misalignment of the first substrate SUB1 and the second substrate SUB2 will not occur.

Here, at the edge of the recessed portion R, as shown in FIG. 5, a corner portion C is formed in the insulating layer 15 and the layers (the pixel electrode PE, the fourth insulating layer 14 and the common electrode CE in the present embodiment) disposed between the organic insulating layer 15 and the metal line ML. Most of light emitted from the backlight 3 and transmitted through the first polarizer 5 is blocked by the scanning line G and does not reach the corner portion C. On the other hand, light L greatly inclined with respect to the Z direction as shown in FIG. 5 is not blocked by the scanning line G but reaches the corner portion C. The light L like this is depolarized at the corner portion C in some cases, and when depolarized, a part of the light L may be transmitted through the second polarizer 6 even when the subpixel is in a black display state. Such a light leakage causes the contrast reduction of the display device.

In this regard, in the present embodiment, the metal line ML has the second part P2 covering around the recessed portion R in addition to the first part P1 covering the inside of the recessed portion R. In this case, the corner portion C is light shielded by the metal line ML. Therefore, a light leakage around the contact hole CH is suppressed, and the display device 1 having high contrast and high definition can be realized.

The present embodiment illustrates a case where the second line width WL2 of the metal line ML is greater than the first opening width WO1 and the second opening width WO2 of the contact hole CH. However, if the corner portion C can be light shielded, the second line width WL2 may be greater than or equal to the first opening width WO1 but less than or equal to the second opening width WO2 or may be less than the first opening width WO1.

The second to ninth embodiments will be described below. The configurations and effects which are not particularly described in these embodiments are the same as the first embodiment.

Second Embodiment

Figure 6:
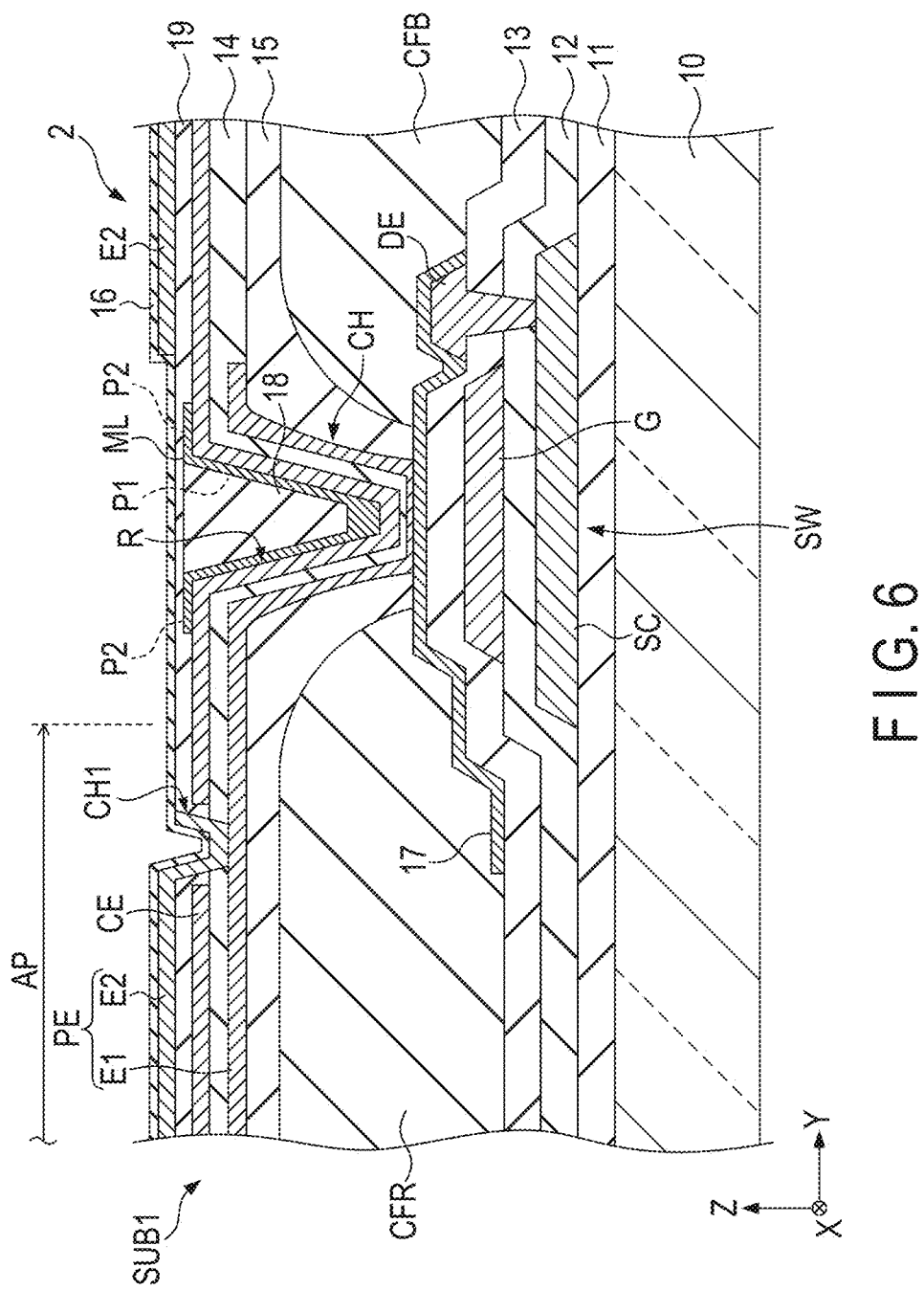
FIG. 6 is a schematic cross-sectional view of the first substrate in the second embodiment.

FIG. 6 is a schematic cross-sectional view of the first substrate SUB1 in the second embodiment. The present embodiment is different from the first embodiment in that the first substrate SUB further comprises a fifth insulating layer 19 and the pixel electrode PE includes a first electrode E1 and a second electrode E2.

The first electrode E1 is disposed on the organic insulating layer 15 and is in contact with the relay electrode 17 through the contact hole CH as is the case with the pixel electrode PE shown in FIG. 5. The first electrode E1 is covered with the fourth insulating layer 14.

The fifth insulating layer 19 is formed of an inorganic material such as silicon nitride or silicon oxide, for example, and covers the common electrode CE, the metal line ML and the filling material 18. The second electrode E2 is disposed on the fifth insulating layer 19, and is in contact with the first electrode E1 through a contact hole CH1 provided in the fourth insulating layer 14 and the fifth insulating layer 19. The second electrode E2 has, for example, one or more long electrode portions in the aperture AP, and is opposed to the common electrode CE. The first alignment film 16 covers the second electrode E2 and the fifth insulating layer 19.

As in the present embodiment, also when the pixel electrode PE (second electrode E2) is located more upward than the common electrode CE, it is possible to obtain the same effects as the first embodiment by applying the same structure as the first embodiment to the contact hole CH and the metal line ML.

Third Embodiment

Figure 7:
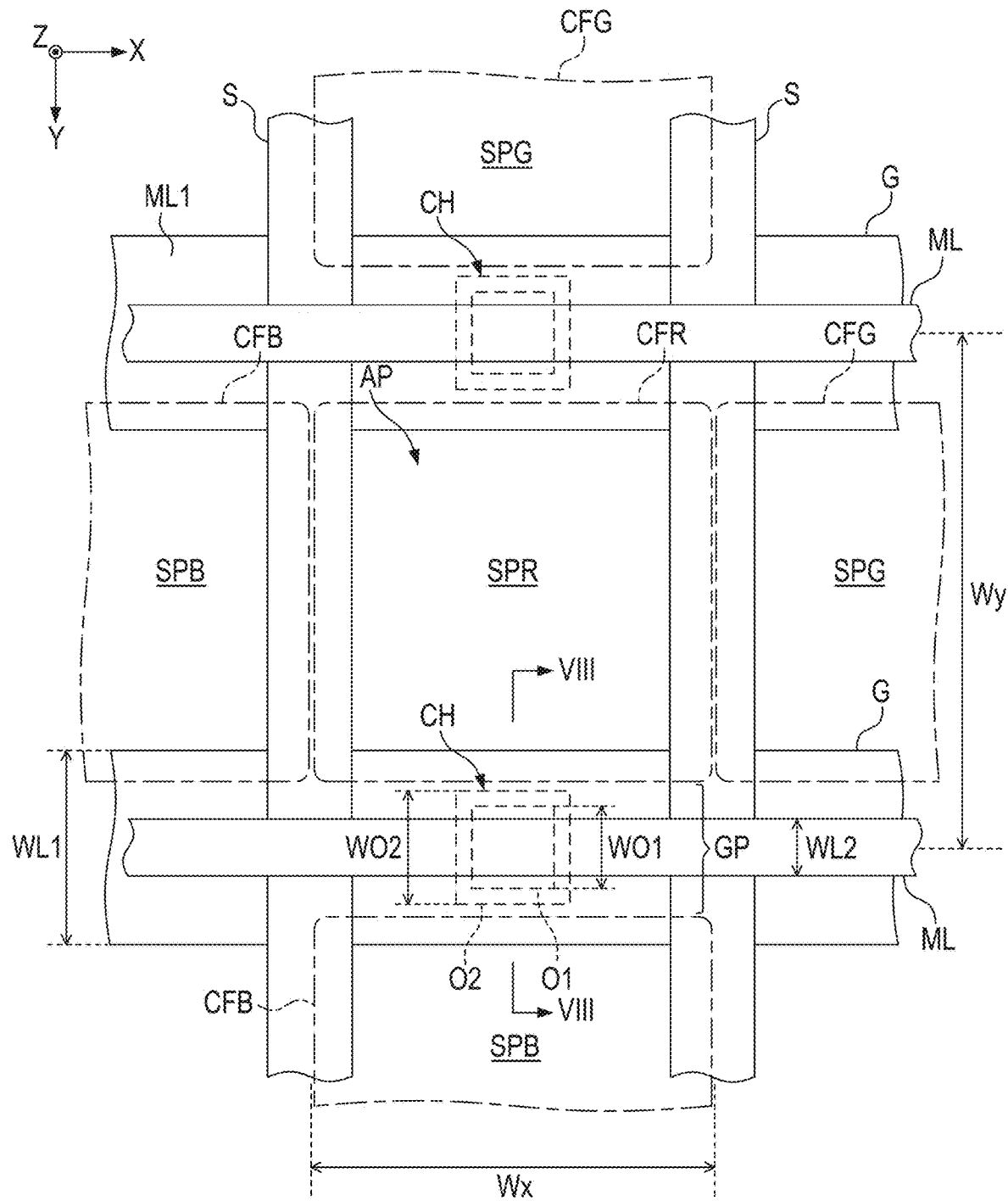
FIG. 7 is a schematic plan view showing part of elements constituting the subpixel in the third embodiment.

FIG. 7 is a schematic plan view showing part of elements constituting the subpixel in the third embodiment. Although the configuration of the subpixel SPR is mainly illustrated here, the subpixels CPG and CPB also have the same configuration as the subpixel SPR. The illustration of the pixel electrode PE, the common electrode CE, the switching element SW and the like is omitted in FIG. 7.

The present embodiment is different from the first embodiment in the shape of the metal lines ML. That is, the metal lines ML entirely overlap the scanning lines G and extend parallel to the scanning lines G, and do not have any parts corresponding to the second line portions ML2 shown in FIG. 4. In addition, the width of the metal line ML is the second line width WL2 and constant over the entirety. However, the width of the metal line ML may partly vary. In the example of FIG. 7, the second line width WL2 is less than the first opening width WO1 of the lower end portion O1 and the second opening width WO2 of the upper end portion O2 of the contact hole CH.

Figure 8:
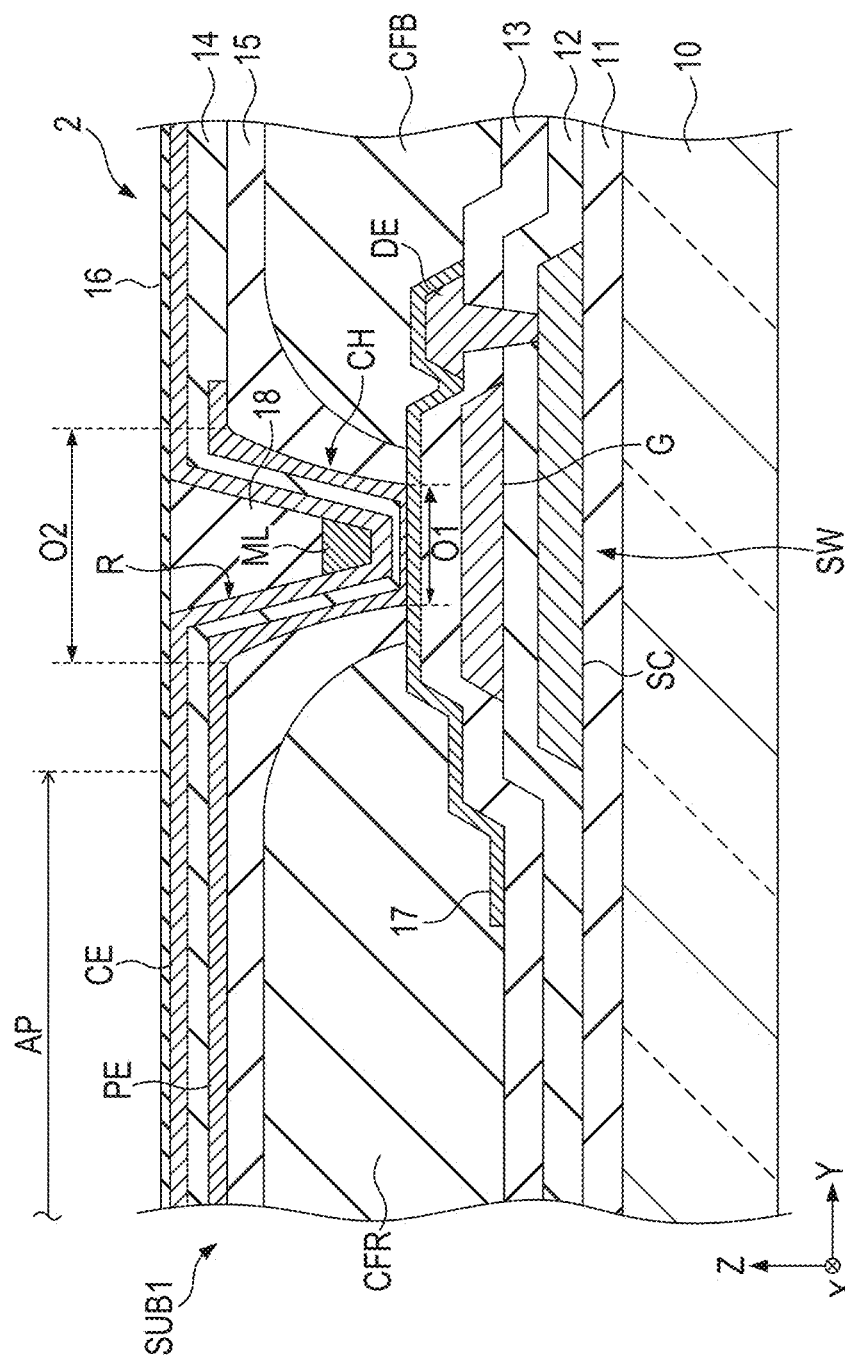
FIG. 8 is a schematic cross-sectional view of the first substrate along line VIII-VIII in FIG. 7.

FIG. 8 is a schematic cross-sectional view of the first substrate SUB1 along line VIII-VIII in FIG. 7. Inside the contact hole CH, the metal line ML is located at the bottom of the recessed portion R, and its upper surface is covered with the filling material 18. That is, the metal line ML does not have any part corresponding to the second part P2 shown in FIG. 5. In a cross section parallel to the X direction of the contact hole CH, the metal line ML entirely covers the inner surface of the recessed portion R.

Since the contact hole CH, the metal line ML and the scanning line G also overlap each other in the present embodiment, the efficient layout of the elements disposed in the display area DA can be achieved. In addition, a part of the contact hole CH can be light shielded by the metal line ML.

Fourth Embodiment

Figure 9:
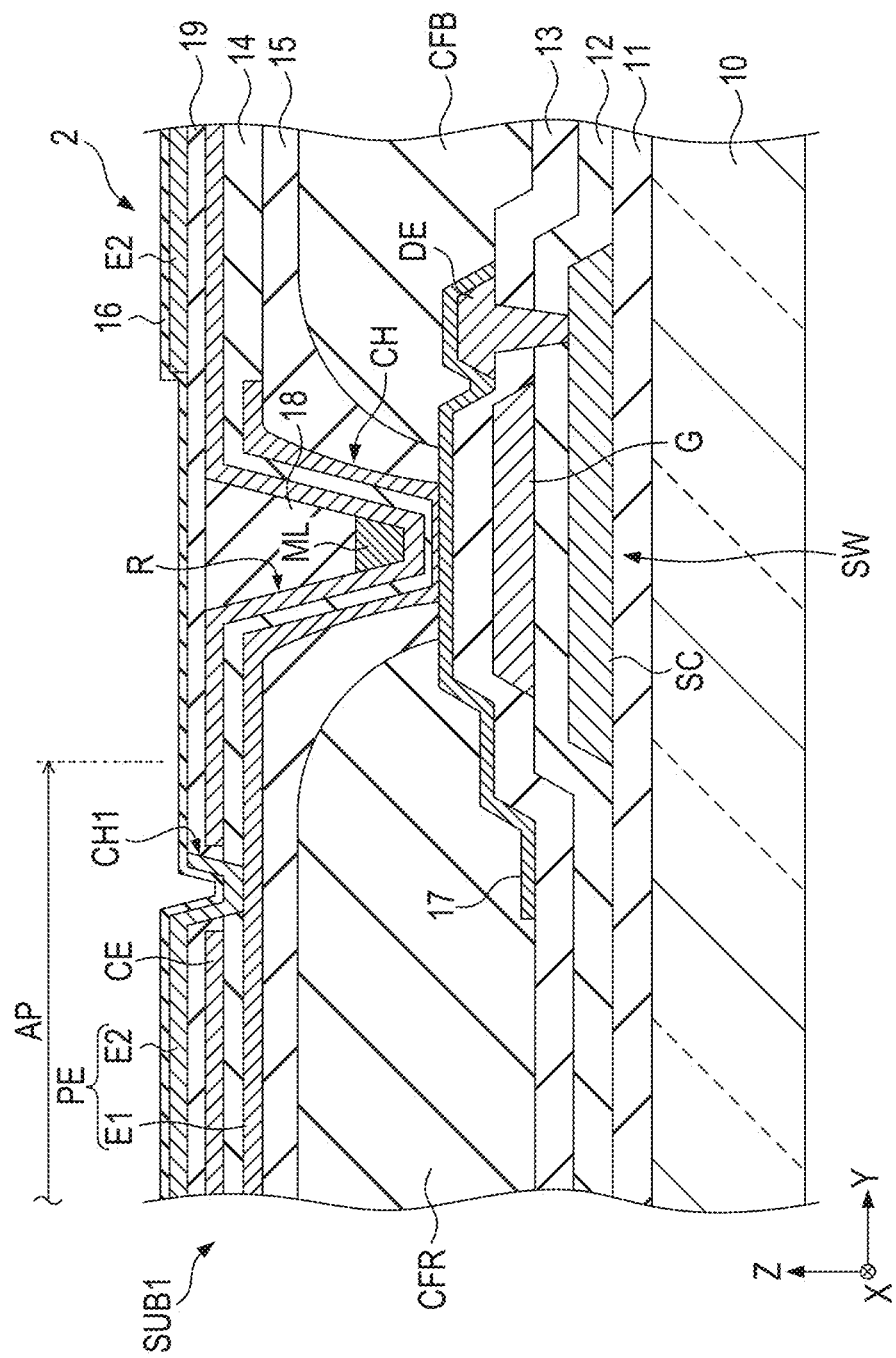
FIG. 9 is a schematic cross-sectional view of the first substrate in the fourth embodiment.

FIG. 9 is a schematic cross-sectional view of the first substrate SUB1 in the fourth embodiment. This first substrate SUB1 comprises the fifth insulating layer 19 and the pixel electrode PE includes the first electrode E1 and the second electrode E2 as is the case in FIG. 6 in the second embodiment. Furthermore, the metal line ML has the same shape as FIG. 8 in the third embodiment. The same effects as the third embodiment can also be obtained in the configuration like this.

Fifth Embodiment

Figure 10:
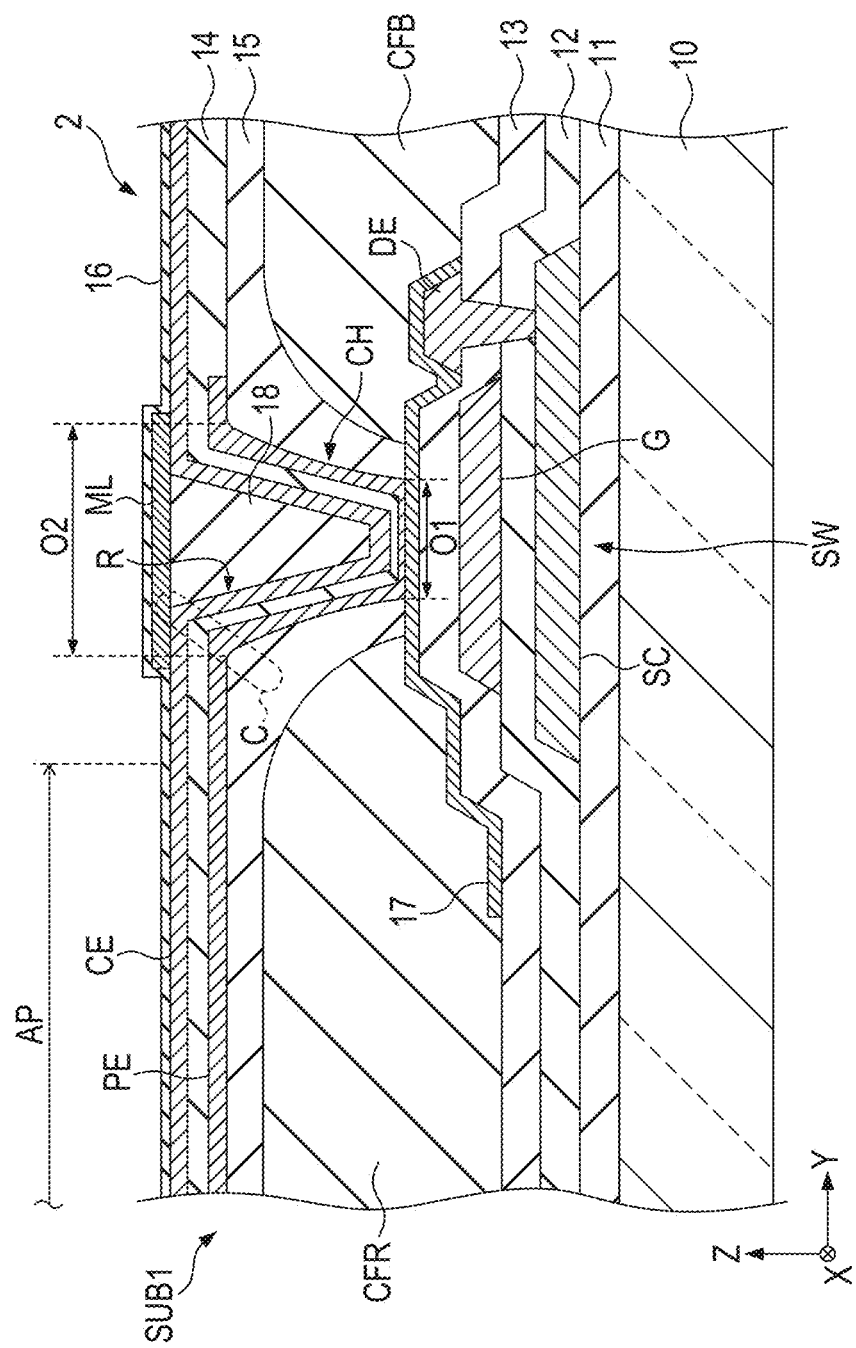
FIG. 10 is a schematic cross-sectional view of the first substrate in the fifth embodiment.

FIG. 10 is a schematic cross-sectional view of the first substrate SUB1 in the fifth embodiment. This first substrate SUB1 is different from the first embodiment in that the metal line ML is located above the filling material 18. More specifically, the central portion in the Y direction of the metal line ML is in contact with the upper surface of the filling material 18, and both end portions in the Y direction of the metal line ML are in contact with the common electrode CE. For example, the metal line ML has the same planar shape as FIG. 4.

By disposing the metal line ML above the filling material 18 as in the present embodiment, it is possible to maintain the metal line ML flat even at the position of the contact hole CH. Therefore, it is possible to suppress the disconnection of the metal line ML.

The metal line ML overlaps the corner portion C around the recessed portion R. Accordingly, as is the case in the first embodiment, a light leakage caused by light reaching the corner portion C can be suppressed.

Sixth Embodiment

Figure 11:
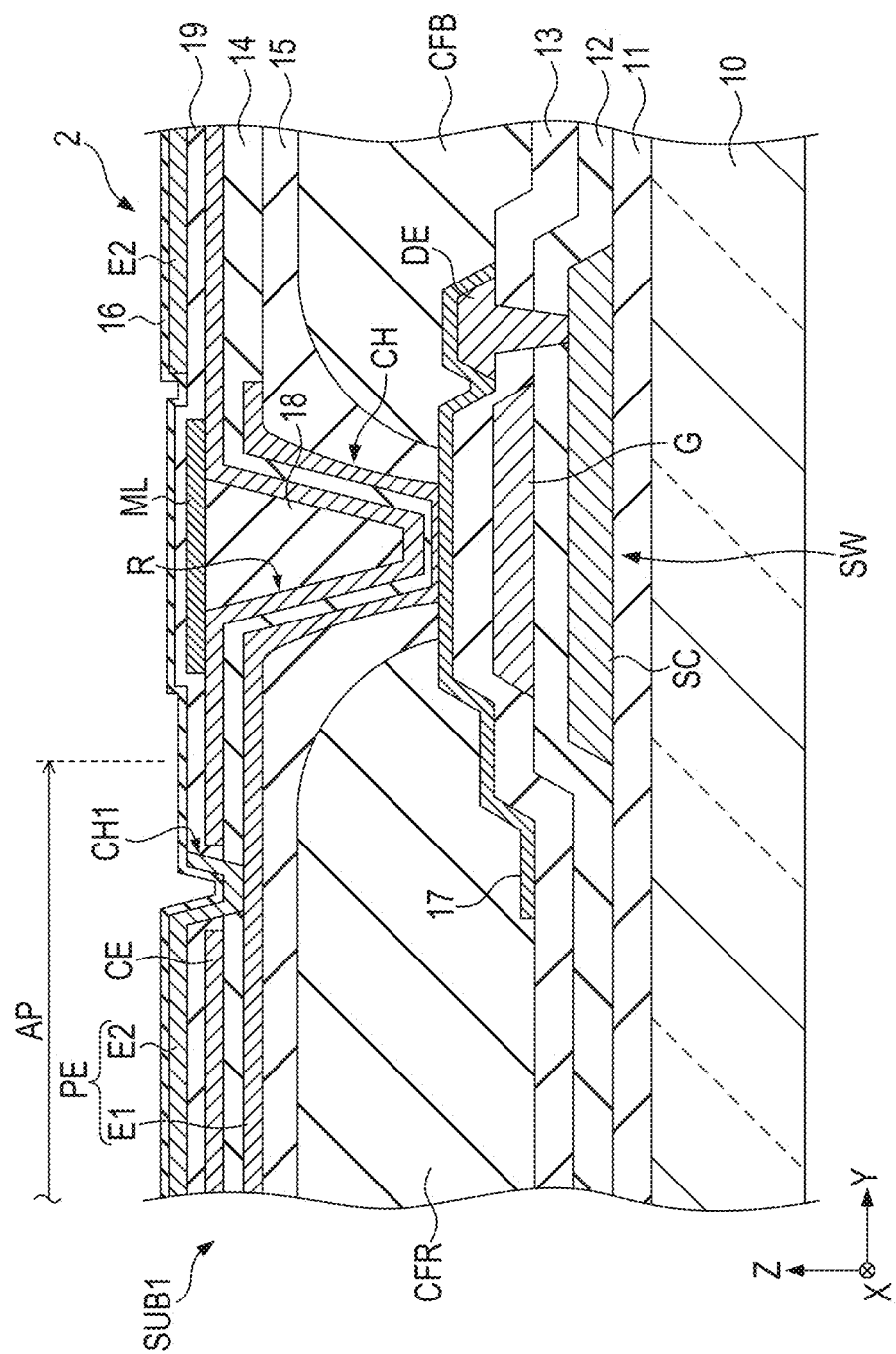
FIG. 11 is a schematic cross-sectional view of the first substrate in the sixth embodiment.

FIG. 11 is a schematic cross-sectional view of the first substrate SUB1 in the sixth embodiment. The first substrate SUB1 comprises the fifth insulating layer 19 and the pixel electrode PE includes the first electrode E1 and the second electrode E2 as is the case in FIG. 6 in the second embodiment. Furthermore, the metal line ML has the same shape as FIG. 10 in the fifth embodiment. The same effects as the fifth embodiment can also be obtained in the configuration like this.

Seventh Embodiment

Figure 12:
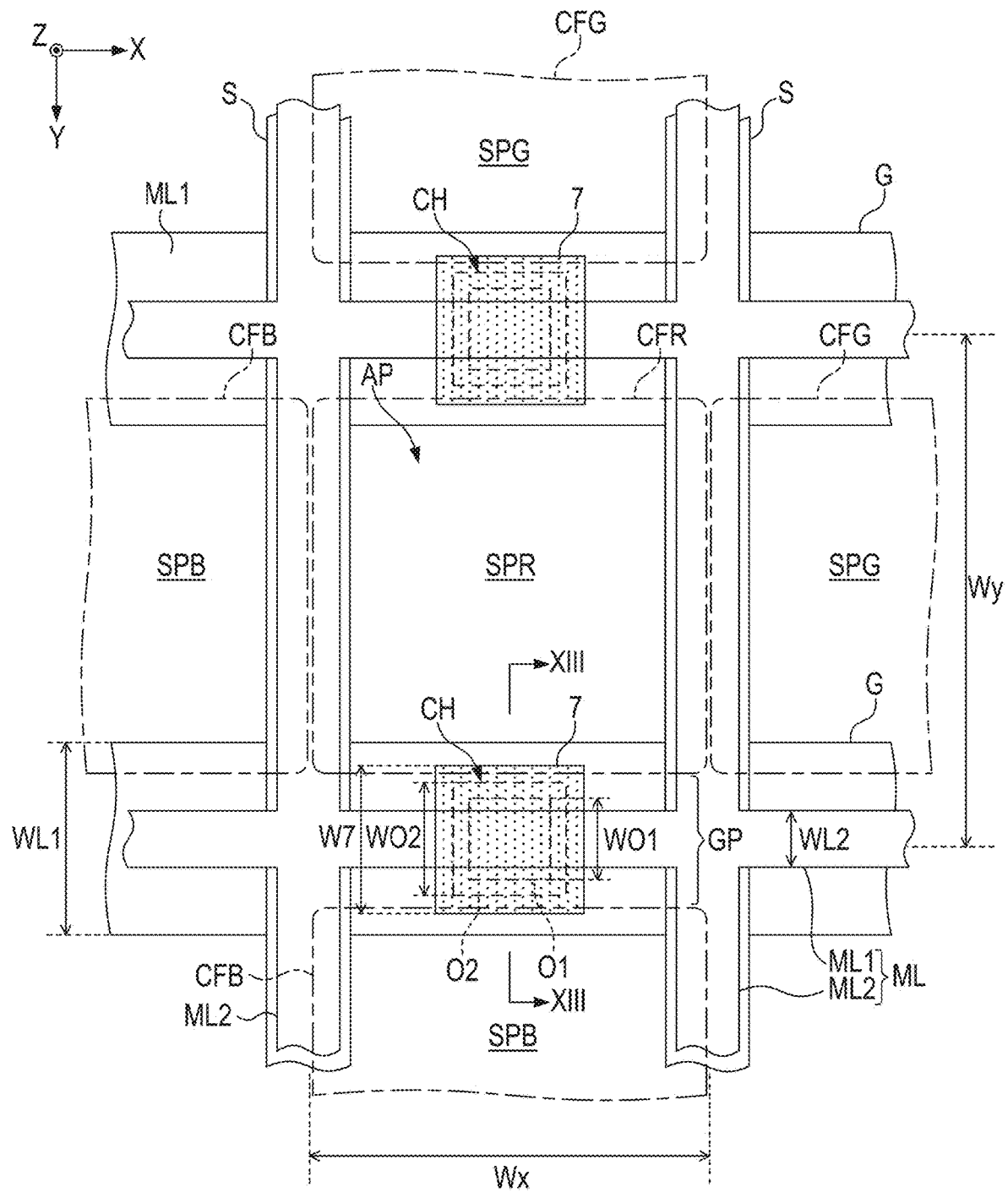
FIG. 12 is a schematic plan view showing part of elements constituting the subpixel in the seventh embodiment.

FIG. 12 is a schematic plan view showing part of elements constituting the subpixel in the seventh embodiment. Although the configuration of the subpixel SPR is mainly illustrated here, the subpixels CPG and CPB also have the same configuration as the subpixel SPR. The illustration of the pixel electrode PE, the common electrode CE, the switching element SW and the like is omitted in FIG. 12.

The present embodiment is different from the first embodiment in that a resin layer 7 is disposed at the position overlapping the contact hole CH. In addition, in the present embodiment, the second line width WL2 of the metal line ML (first line portion ML1) is less than the first opening width WO1 of the contact hole CH. The resin layer 7 is formed of, for example, light-shielding black resin, and has a function as a light-shielding layer which light shields the contact hole CH.

The resin layer 7 overlaps the entire contact hole CH. That is, a width W7 in the Y direction of the resin layer 7 is greater than the second opening width WO2. The width in the X direction of the resin layer 7 is the same as the width W7, for example.

If the resin layer 7 protrudes from the scanning line G, the aperture AP becomes small. In order to suppress this, the width W7 is preferably less than the first line width WL1 of the scanning line G by greater than or equal to 1 μm. As an example, the first line width WL1 is 5 μm, the width W7 is 4 μm, and the second opening width WO2 is 3 μm.

Figure 13:
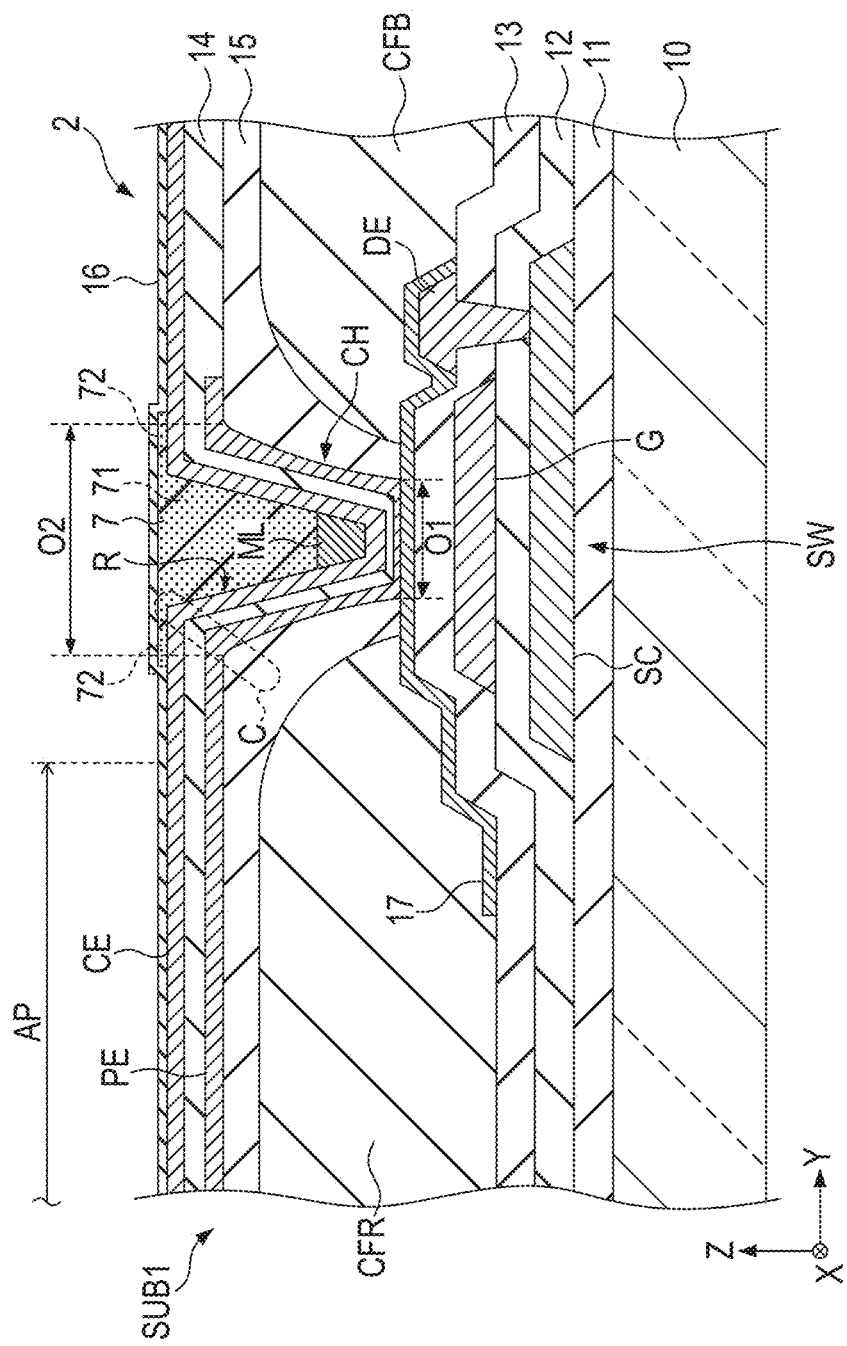
FIG. 13 is a schematic cross-sectional view of the first substrate along line XIII-XIII in FIG. 12.

FIG. 13 is a schematic cross-sectional view of the first substrate along line XIII-XIII in FIG. 12. The metal line ML is located at the bottom of the recessed portion R as is the case in FIG. 8 of the third embodiment. The resin layer 7 fills the recessed portion R, and also protrudes over around the recessed portion R.

That is, the resin layer 7 has a first part 71 entirely covering the upper surface of the metal line ML and the inner surface of the common electrode CE in the recessed portion R, and a second part 72 covering the surface of the common electrode CE around the recessed portion R. At least a part of the second part 72 projects more upward than the surface of an area of the common electrode CE which does not overlap the contact hole CH (for example, the surface of the common electrode CE in the aperture AP).

When the light-shielding resin layer 7 of the present embodiment is provided, the above-described corner portion C is light shielded by the resin layer 7. Accordingly, as is the case in the first embodiment, a light leakage caused by light reaching the corner portion C can be suppressed.

The present embodiment illustrates a case where the width W7 of the resin layer 7 is greater than the first opening width WO1 and the second opening width WO2 of the contact hole CH. However, if the corner portion C can be light shielded, the width W7 may be greater than or equal to the first opening width WO1 but less than or equal to the second opening width WO2 or may be less than the first opening width WO1.

Eighth Embodiment

Figure 14:
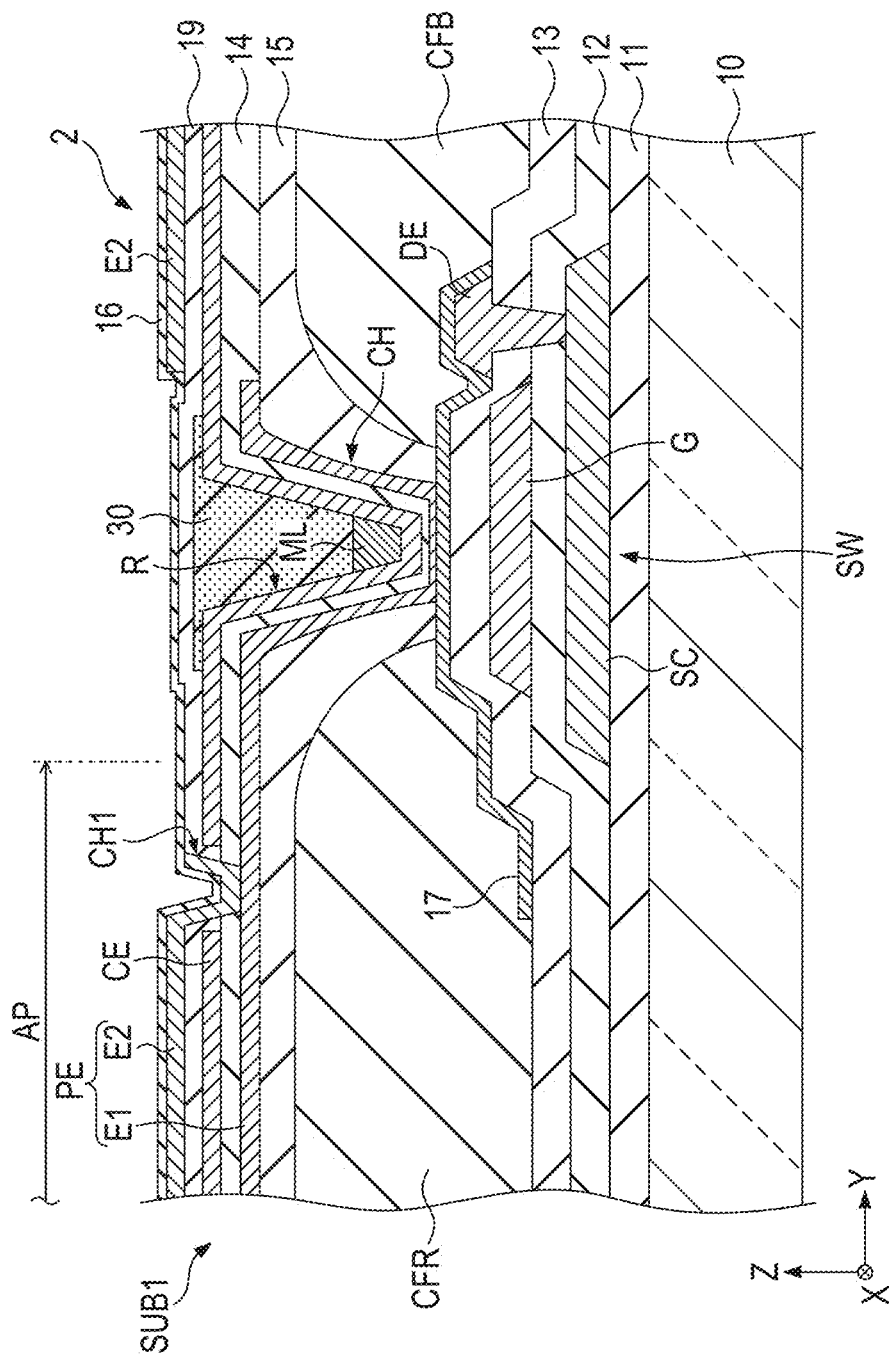
FIG. 14 is a schematic cross-sectional view of the first substrate in the eighth embodiment.

FIG. 14 is a schematic cross-sectional view of the first substrate SUB1 in the eighth embodiment. The first substrate SUB1 comprises the fifth insulating layer 19 and the pixel electrode PE includes the first electrode E1 and the second electrode E2 as is the case in FIG. 6 in the second embodiment. A resin layer 30 is covered with the fifth insulating layer 19. The other configuration is the same as the seventh embodiment. The same effects as the seventh embodiment can also be obtained in the configuration of the present embodiment.

Ninth Embodiment

Figure 15:
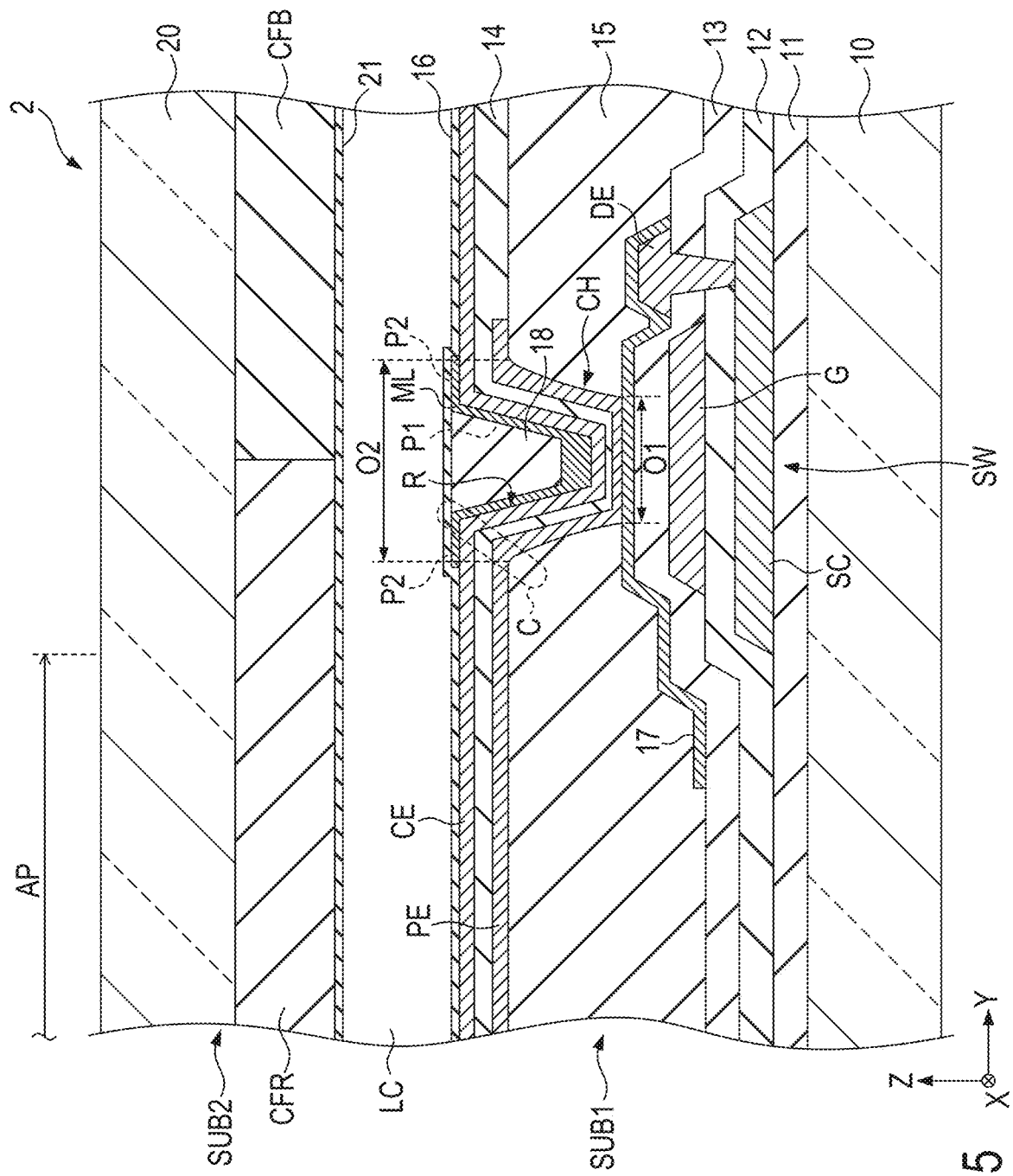
FIG. 15 is a schematic cross-sectional view of the display panel in the ninth embodiment.

FIG. 15 is a schematic cross-sectional view of the display panel 2 in the ninth embodiment. In this display panel 2, the color filters CFR and CFB are provided not in the first substrate SUB1 but in the second substrate SUB2. Although not shown in the cross section of FIG. 15, the color filter CFG is also provided in the second substrate SUB2. The configuration of the first substrate SUB1 is the same as FIG. 5 in the first embodiment except that the color filters CFR, CFG and CFB are not disposed.

The color filters CFR, CFG and CFB are located between the second insulating base 20 and the second alignment film 21. An insulating layer may be disposed between the second insulating base 20 and the color filters CFR, CFG and CFB and between the second alignment film 21 and the color filters CFR, CFG and CFB. The boundary of two adjacent color filters in the Y direction of the color filters CFR, CFG and CFB overlaps the metal line ML, the scanning line G and the contact hole CH.

Also in the present embodiment, the inside of the contact hole CH and the above-described corner portion C are light shielded by the metal line ML. Accordingly, as is the case in the first embodiment, a light leakage caused by light reaching the corner portion C can be suppressed.

The present embodiment illustrates a case where the color filters CFR, CFG and CFB are provided in the second substrate SUB2 in the configuration of the display panel 2 according to the first embodiment. However, the color filters CFR, CFG and CFB may also be provided in the second substrate SUB2 in the configuration of the display panel 2 according to the second to eighth embodiments.

All display devices, array substrates, electronic devices and the like, which are implementable with arbitrary changes in design by a person of ordinary skill in the art based on the display devices described above as the embodiments of the present invention, belong to the scope of the present invention as long as they encompass the spirit of the present invention.

Various modifications are easily conceivable within the category of the idea of the present invention by a person of ordinary skill in the art, and these modifications are also considered to belong to the scope of the present invention. For example, additions, deletions or changes in design of the constituent elements or additions, omissions or changes in condition of the processes may be arbitrarily made to the above embodiments by a person of ordinary skill in the art, and these modifications also fall within the scope of the present invention as long as they encompass the spirit of the present invention.

Still further, the other advantages of the aspects described in the embodiments, which are obvious from the descriptions of the specification or which are arbitrarily conceivable by a person of ordinary skill in the art, are considered to be achievable by the present invention as a matter of course.

What is claimed is:
1. A display device comprising:
a substrate;

a switching element disposed above the substrate and including a gate electrode and a drain electrode;

a scanning line connected to the gate electrode of the switching element;

an organic insulating layer covering the switching element and having a contact hole;

a pixel electrode disposed above the organic insulating layer and connected to the drain electrode of the switching element through the contact hole;

a common electrode opposed to the pixel electrode with an inorganic insulating film interposed therebetween; and a metal line disposed above the organic insulating layer and extending parallel to the scanning line, wherein the scanning line, the metal line and the contact hole overlap each other in planar view, the common electrode has a recessed portion recessed toward an inside of the contact hole, and the metal line covers an edge of the recessed portion.

2. The display device of claim 1, wherein the scanning line has a first line width at a position overlapping the contact hole, and the metal line has a second line width less than the first line width at the position overlapping the contact hole.

3. The display device of claim 2, wherein the contact hole has a first opening width at a lower end portion on a side close to the switching element, and the second line width is greater than the first opening width and less than the first line width.

4. The display device of claim 3, wherein the contact hole has a second opening width at an upper end portion on a side opposite to the lower end portion, and the second line width is greater than the second opening width.

5. The display device of claim 1, wherein the metal line is recessed toward the inside of the contact hole at a position overlapping the contact hole.

6. The display device of claim 1, wherein the metal line has a first part covering an inner surface of the common electrode in the recessed portion, and a second part covering a surface of the common electrode around the recessed portion.

7. The display device of claim 6, further comprising a filling material filling an inside of the first part.

8. The display device of claim 1, further comprising a filling material filling the inside of the contact hole, wherein the metal line is located above the filling material.

9. The display device of claim 1, further comprising a color filter covered with the organic insulating layer.

10. The display device of claim 1, further comprising a plurality of color filters disposed respectively for a plurality of subpixels, wherein the contact hole is located in a gap formed between adjacent two of the color filters.

* * * * *